United States Patent [19]

Watanabe et al.

[11] 4,396,868

[45] Aug. 2, 1983

[54] LAMP CIRCUIT WITH DISCONNECTED LAMP DETECTING DEVICE

[75] Inventors: Toshisuke Watanabe, Hachiooji; Shozo Taniguchi, Fussa; Osafumi Takemoto, Tokyo, all of Japan

[73] Assignee: Tokyo Shibaura Denki Kabushiki Kaisha, Kanagawa, Japan

[21] Appl. No.: 238,116

[22] Filed: Feb. 25, 1981

[30] Foreign Application Priority Data

Mar. 13, 1980 [JP] Japan ............................ 55-30878

[51] Int. Cl.³ .......................................... H02K 33/00
[52] U.S. Cl. .................................. 315/130; 315/131; 315/189; 340/642
[58] Field of Search ............... 340/642; 315/130, 131, 315/189

[56] References Cited

U.S. PATENT DOCUMENTS

| | | | |
|---|---|---|---|
| 3,054,991 | 9/1962 | Howell | 340/642 |
| 3,061,828 | 10/1962 | Hauck | 340/642 |
| 3,892,735 | 8/1974 | Berlock et al. | 315/131 |
| 4,295,079 | 10/1981 | Otsuka et al. | 340/642 |

*Primary Examiner*—Harold A. Dixon

*Attorney, Agent, or Firm*—Oblon, Fisher, Spivak, McClelland & Maier

[57] ABSTRACT

A lamp circuit is provided having a constant current-type AC power source and a plurality of isolation transformers coupled in series with the AC power source. The secondary circuit of each isolation transformer is connected to an electric lamp. The output voltage of the constant current-type AC power source is detected to determine the times when the output voltage crosses the zero voltage level. A disconnected lamp in the circuit results in a distortion of the output voltage waveform due to the magnetic-saturation characteristics of the isolation transformer coupled to the disconnected lamp. The output voltage waveform is integrated over time between the time periods when the output voltage signal crosses the zero axis. The result of the integration is compared with a reference value. When the integrated value exceeds the reference value, an alarm signal is generated. The number of disconnected lamps may also be determined and displayed. The circuit includes a device for supplying a small current to the plurality of isolation transformers such that the status of the lamps in a circuit can be determined without illuminating any of the lamps in the circuit.

28 Claims, 9 Drawing Figures

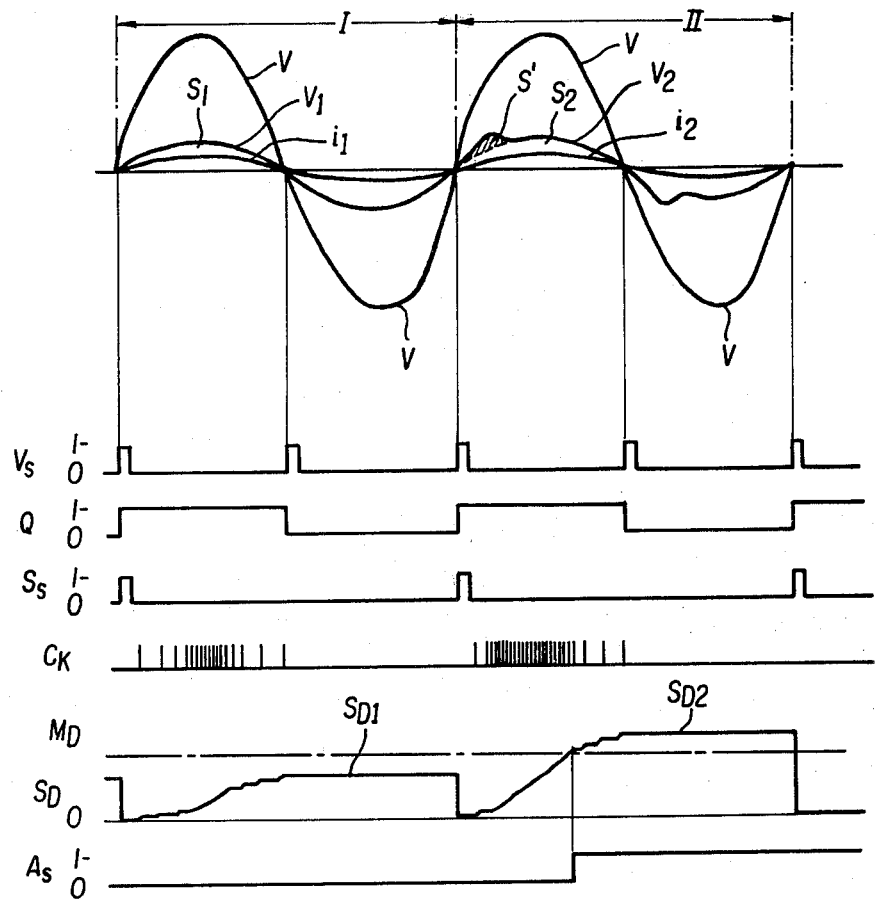
FIG. 5
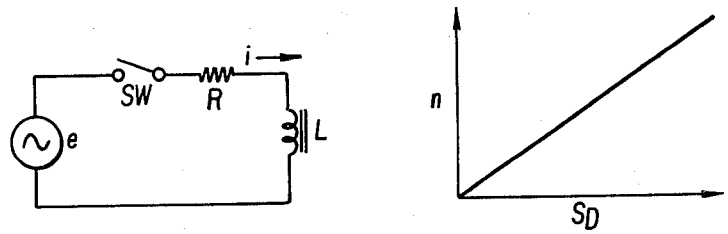
FIG. 6
FIG. 7

LAMP CIRCUIT WITH DISCONNECTED LAMP DETECTING DEVICE

BACKGROUND OF THE INVENTION

1. Field of the Invention

This invention generally relates to a lamp circuit in which an AC power source is connected to a plurality of lamps through a plurality of isolation transformers, respectively, and more particularly to a lamp circuit with a disconnected lamp detecting device.

2. Description of the Prior Art

A conventional thyristor-type constant current regulator (hereinafter designated as CCR), as shown in FIG. 1, has been employed as a power supply for a lamp circuit for use in lighting an airport runway.

In FIG. 1, numeral 1 designates an AC power source. Numeral 20 designates a thyristor-type CCR, wherein 2 designates a smoothing reactor, 3 and 4 designate thyristors, 5 designates an output transformer, 6 designates a current transformer, 7 designates a differential amplifier, 8 designates a gate control circuit, and 13 designates a reference current input adjuster. Numeral 9 designates a potential transformer, 10 designates a disconnected lamp detecting device, and 11 designates an alarm device. Numeral 12 designates a series lamp circuit which comprises a plurality of series connected isolation transformers 121, the primary windings of which are connected in series with each other. The secondary winding of each transformer 121 is connected to a lamp 122. The series lamp circuit 12 is connected to the output transformer 5.

As shown in FIG. 1, the output current i of the thyristor-type CCR 20 is detected by the current transformer 6 and is compared with the signal Cs of the reference current input adjuster 13 in the differential amplifier 7. The differential amplifier 7 amplifies the compared signal and produces a signal Go, which is applied to the gate control circuit 8. The gate control circuit 8 produces gate signals G1 and G2, in response to the signal Go, which are supplied to the respective gates of the thyristors 3 and 4 so as to maintain the output current of the thyristor-type CCR 20 at a constant level, i.e., to keep the intensity of the lamps 122 at a constant level.

One example of the disconnected lamp detecting device 10 is shown in FIG. 2 in detail. After the voltage signal v of the potential transformer 9 and the current signal i of the current transformer 6 are rectified by respective full-wave rectifiers $D_1$ and $D_2$, the difference signal e between the two outputs of the rectifiers $D_1$ and $D_2$ is produced. After smoothing the difference signal e, the smoothed signal is supplied to the base terminal of a transistor Tr which produces an alarm signal A to activate the alarm device 11 when the value of the smoothed signal exceeds a predetermined value. The alarm device 11 indicates the alarm condition by means of a buzzer or a lamp in response to the alarm signal A.

In the case where no lamp 122 is disconnected, the voltage signal v and the current signal i become waveforms $v_1$ and $i_1$, respectively, as shown in FIGS. 3(a) and 3(b). Therefore, the difference signal e between these signals becomes the waveform $e_1$ shown in FIG. 3(c). At this time since the transistor Tr is not turned on, the alarm signal A is not produced.

If it is assumed that a number of lamps 122 are disconnected, the voltage signal v and the current signal i become the waveforms $v_2$ and $i_2$, respectively, shown in FIGS. 3(d) and 3(e) wherein the waveform $v_2$ rises sharply while waveform $i_2$ rises more slowly. Therefore, the difference signal e becomes the waveform $e_2$ shown in FIG. 3(f). The difference signal e is smoothed and applied to the transistor Tr which turns on thereby producing the alarm signal A.

The detection of the disconnected lamps is thus carried out. However, the waveforms of the voltage signal v and the current signal i are analog signals, and often deformed by disturbances, such as noise, which are characteristic of analog signals. Therefore, even though a lamp is not actually disconnected, the voltage value of the smoothed difference signal reaches a value sufficient to operate the transistor Tr of the disconnected lamp detecting device 10. As a result, a false alarm signal A is produced.

To prevent such an above-mentioned misdetection, the operating voltage value, which makes the transistor Tr operate, must be set to a large value; however, this makes it impossible to detect disconnecting lamps with high-sensitivity. Therefore, the sensitivity of the detection is limited to about ten percent of the rated load, and thus the desired sensitivity of detection within a limit of about five percent of the rated load cannot be achieved.

There is the danger of increasing the risks to aircraft due to a defect in the runway lighting of an airport. Moreover, when an isolation transformer, in which the secondary winding has been opened by a disconnected lamp, is left for a long period of time, there arises a danger of a winding short upon the application of a high-voltage pulse and the danger of a burn-out due to rising temperature. Furthermore, to display the number of actually disconnected lamps in addition to the alarm function, it is necessary to provide a new display circuit.

Moreover, even when the disconnected lamp is detected, it is impossible to exchange the disconnected lamp with a new one while the series lamp circuit is energized because the disconnected lamp is located on the runway and changing it is very dangerous. Also, in order to detect the disconnected lamp it is necessary that the series lamp circuit be lighted; therefore, detection of the disconnected lamp is performed only when the series lighting circuit is in an energized condition.

SUMMARY OF THE INVENTION

Accordingly, one object of this invention is to provide a novel lamp circuit which can detect disconnected lamps with high sensitivity.

Another object of this invention is to provide a novel lamp circuit which is reliable in operation and simple in construction.

Still another object of this invention is to provide a novel lamp circuit which can detect a disconnected lamp while the lamp circuit is in a deenergized condition.

Another object of this invention is to provide a novel lamp circuit which can check the connection state of the lamps in the lamp circuit prior to actual operation thereof.

Still another object of this invention is to provide a novel lamp circuit which can easily indicate the number of the disconnected lamps.

Yet another object of this invention is to provide a novel lamp circuit wherein replacement of disconnected lamps are planned in advance according to the state of disconnected lamps thereby improving the efficiency of the maintenance work and thereby allowing a reduction in the required maintenance work force.

These and other objects of this invention can be achieved by providing a lamp circuit including a series lamp circuit wherein a plurality of isolation transformers are connected in series with each other, and wherein a plurality of lamps are connected to the isolation transformers such that one lamp is connected to each transformer. An AC power supply device is connected to the series lamp circuit for supplying an AC current to the plurality of isolation transformers and associated lamps. The lamp circuit also includes a disconnected lamp detecting device connected to the AC power supply device for detecting an output voltage thereof and for determining a voltage-time integral of the detected output voltage during a predetermined time period.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5 is a time chart showing the operation of the lamp circuit shown in FIG. 4;

FIG. 6 is an equivalent circuit of the series lamp circuit shown in FIG. 1;

FIG. 7 is a graph showing a relationship between the integrated output value SD of a counter and the number of disconnected lamps n in the circuit shown in FIG. 4;

DETAILED DESCRIPTION OF THE PREFERRED EMBODIMENTS

Figure 4:
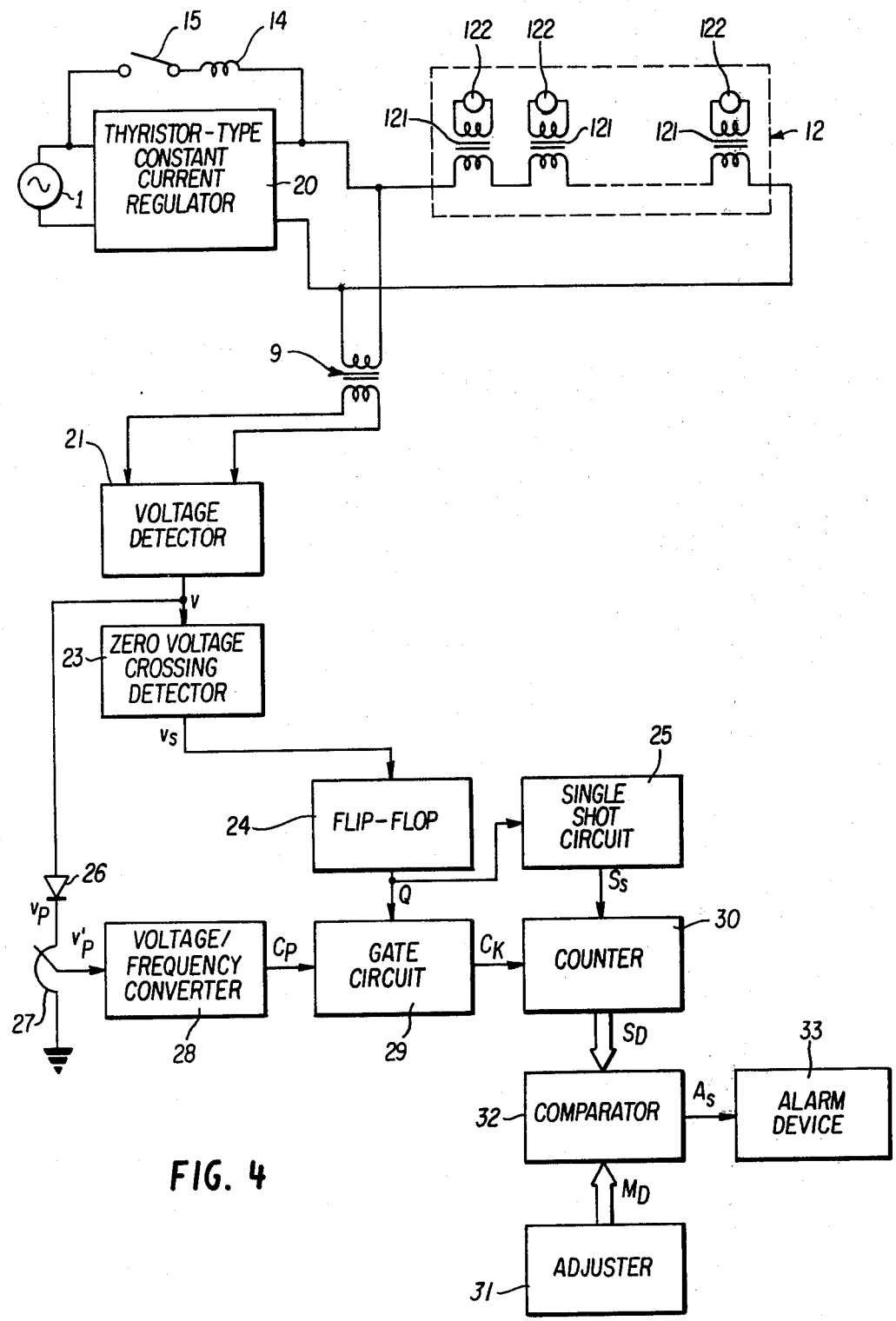
FIG. 4 is a circuit diagram of a lamp circuit according to a preferred embodiment of this invention.

Referring now to the drawings, wherein like reference numerals and letters designate identical or corresponding parts throughout the several views, and more particularly to FIG. 4 thereof, wherein one preferred embodiment of a lamp circuit according to this invention is shown, the thyristor-type CCR 20 is provided between the AC power source 1 and a load 12. Load 12 may be, for example, a series lamp circuit including a plurality of series connected isolation transformers 121 which are connected to lamps 122, respectively.

A reactor 14 and a relay contact 15 are connected in series across the thyristor-type CCR 20, as shown, to provide a small current flow in the load 12. Numeral 21 designates a voltage detector which produces a voltage signal v having an amplitude which varies in response to the output of the potential transformer 9. A zero voltage crossing detector 23 is connected to the voltage detector 21 for receiving the voltage signal v. The zero voltage crossing detector 23 produces a signal vs which takes the level "1" when the voltage signal v crosses the zero level. The signal vs remains in the "1" state for a predetermined time which is sufficiently smaller than the interval between the times when the voltage signal v crosses the zero level.

A flip-flop 24, connected to receive the signal vs is set by the first signal vs (consequently the output Q takes the level "1") and is reset by the following signal vs (consequently the output Q takes the level "0").

A single shot circuit 25 is connected to the output Q of the flip-flop 24 and generates a single shot signal Ss when the output Q takes the level "1".

A diode 26, connected to the voltage detector 21, half-wave rectifies the voltage signal v to produce a voltage signal vp. A potentiometer 27 connected to the diode 26 sets a voltage signal vp' by dividing the voltage signal vp.

A voltage to frequency converter 28 oscillates at a frequency proportional to the positive voltage value vp' and generates a pulse train Cp. A gate circuit 29 passes the pulse train Cp only when the output Q of the flip-flop 24 is at the level "1", whereby the pulse train Ck is generated.

A counter 30 counts the pulse train Ck and transmits, as a result, a digital number SD. The counter 30 is cleared when the single shot signal Ss takes the level "1".

An adjustment means, such as the disconnected lamp quantity input adjuster 31, is used to set the number of disconnected lamps MD to be alarmed. A comparator 32 compares the output digital value SD of the counter 30 with the set number MD of the input adjuster 31 and produces an alarm signal AS when the value SD exceeds the set number MD.

The alarm device 33, details of which are not shown, comprises a flip-flop set by the alarm signal As and reset by a manual resetting switch, an alarm buzzer, an alarm lamp, and switches for operating the alarm device as is apparent to those skilled in the art.

The operation of the lamp circuit shown in FIG. 4 will be explained with reference to the time chart shown in FIG. 5. In FIG. 5, area I shows the case where no lamp 122 is disconnected and area II shows the case where at least one lamp 122 is disconnected. Numeral suffixes corresponding to Area I and Area II have been added to the reference letters used in FIG. 5.

Figure 1:
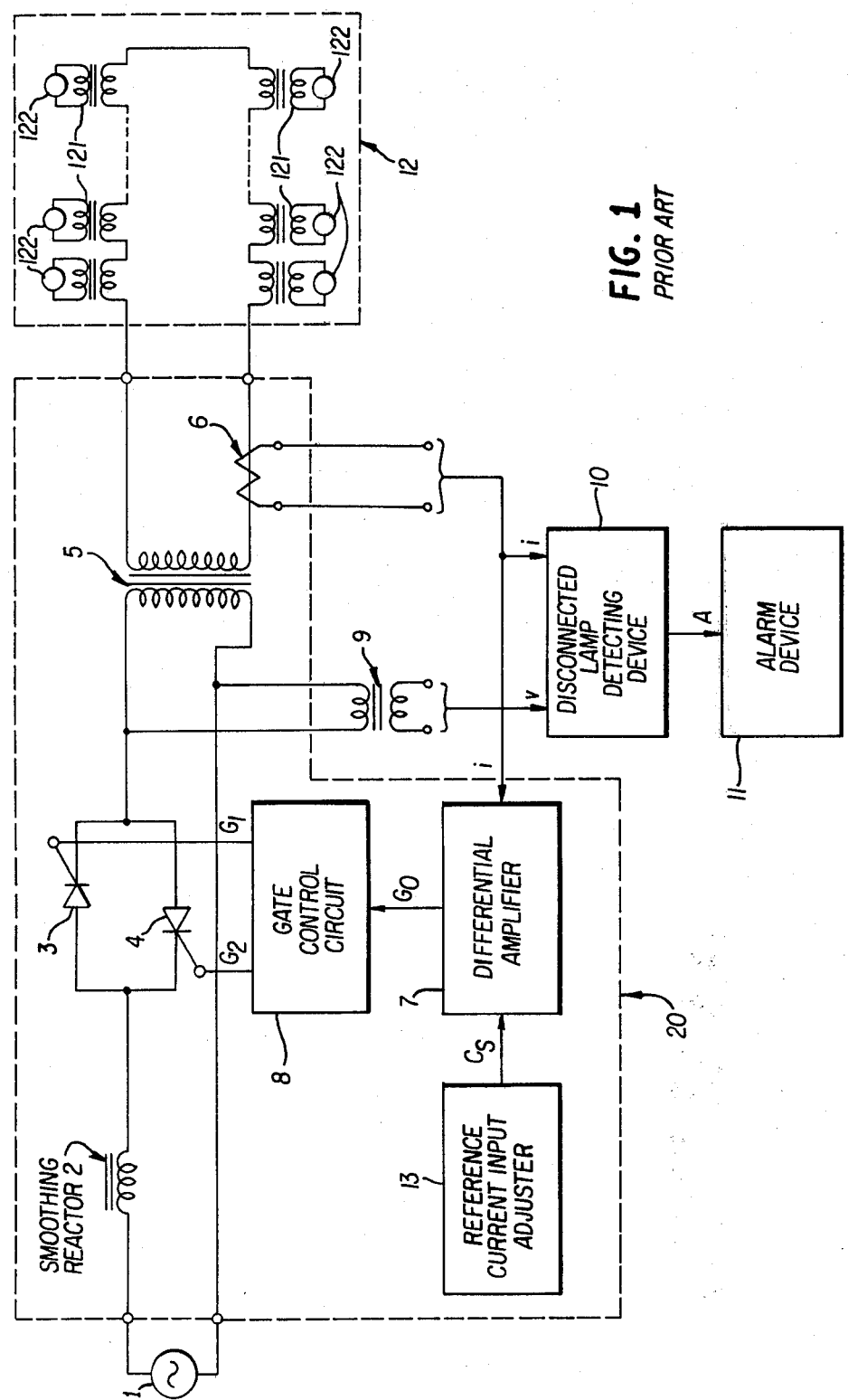
FIG. 1 is a circuit diagram of a conventional lamp circuit.
Figure 2:
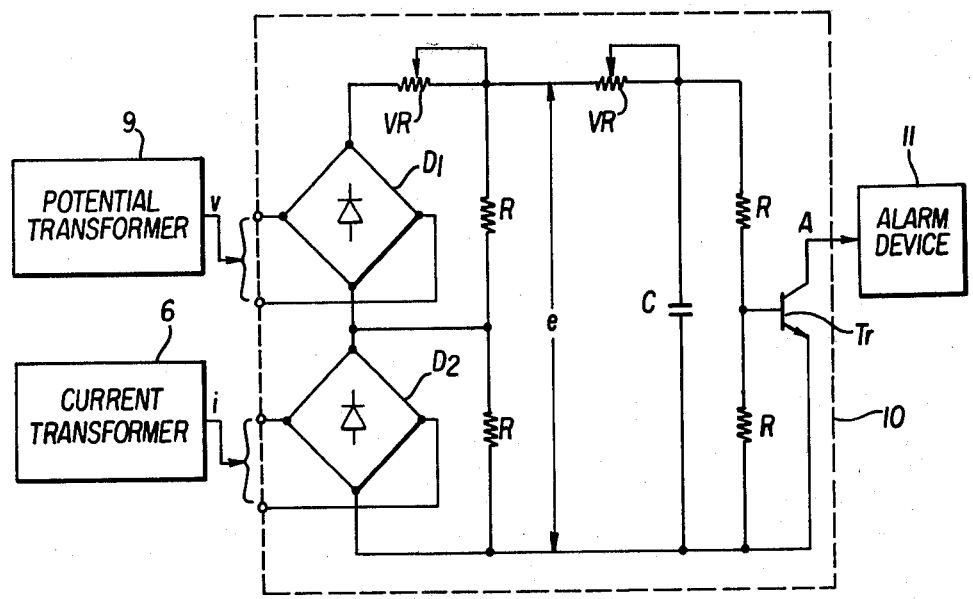
FIG. 2 is a circuit diagram of the detecting device shown in FIG. 1.
Figure 3:
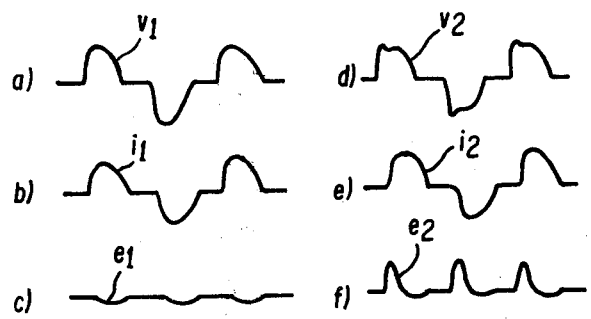
FIGS. 3(a) to 3(f) are waveforms showing the operation of the detecting device shown in FIG. 2.

In the thyristor-type CCR 20, the firing phase of the thyristors 3 and 4 is controlled so as to supply a constant current as set by the reference current input adjuster 13 shown in FIG. 1.

When the thyristor-type CCR 20 is operating, the relay contact 15 must be open. When the detection of the disconnected lamps 122 is to be started, the thyristor-type CCR 20 must be disabled. The relay contact 15 is closed only when the thyristor-type CCR 20 is disabled. A small current flows from the power source 1 to the series lamp circuit 12 through the relay contact 15 and the reactor 14, which is not sufficient to make the lamps 122 light. Therefore, in the case where there are no disconnected lamps 122 in the series lamp circuit 12, the waveforms of the voltage signal v and current signal i with reference to an input voltage signal V of the power source 1 become the waveforms $v_1$ and $i_1$ shown in FIG. 5.

If it is assumed that a certain lamp is disconnected, since the secondary winding of the isolation transformer 121 which is connected to the disconnected lamp 122 is opened, a magnetic saturation phenomenon is created which increases the load inductance of the series lamp circuit 12. Therefore, the voltage signal v generates a voltage proportional to the load inductance until the magnetic saturation of the isolation transformer 121 connected to the disconnected lamp 122 is completed. Thus the waveform of the voltage signal v becomes the waveform $v_2$ which rapidly rises after crossing the zero level shown in FIG. 5.

In FIG. 5 the waveform of the current signal i when a certain lamp 122 is disconnected, is the waveform $i_2$. The rate of rise of the waveform $v_2$ after crossing the zero level is increased as the number of disconnected lamps 122 increases. The rate of increase in the waveform $v_2$ is obtained from an equivalent circuit comprising a coil made of an iron core to be magnetically saturated having an inductance L and a resistance R as shown in FIG. 6. If it is assumed that the number of turns in a coil having the inductance L is N, an equation (1) is obtained for the circuit of FIG. 6, as follows:

$$Ri + N\frac{d\phi}{dt} = e \tag{1}$$

where
  e: voltage of the power source
  $\phi$: flux
  t: time

If the value Ri is negligible with respect to the voltage e, the change in flux $\Delta\phi$ during a minor time from time zero to time t is obtained as follows:

$$\Delta\phi = \frac{1}{N} \int_0^t e\,dt \tag{2}$$

Therefore, the current i in FIG. 6 begins to flow into the resistance R when the voltage e of the power source exceeds the saturation voltage of the coil.

If it is assumed that a saturated time t is to and a saturated flux is $\phi_S$ at this time, since the flux changes from a value $-\phi_S$ to a value of $+\phi_S$, the change in flux $\Delta\phi$ is obtained from the following equation (3):

$$\Delta\phi = \frac{1}{N} \int_0^{to} e\,dt = 2\phi_S \tag{3}$$

If the equation (3) is now rearranged by a characteristic constant of the coil having an iron core the equation becomes as follows:

$$So = \int_0^{to} e\cdot dt = 2\phi_S N \tag{4}$$

Namely, it should be readily apparent that the voltage-time integral So until the iron core of the coil is saturated becomes a constant. Accordingly, an equation indicating the relationship between the number of coils n, i.e., number of isolation transformers 121, having disconnected lamps 122 and the voltage-time integral S required for magnetic-saturation is obtained as follows:

$$S = 2\phi_S \cdot N \cdot n \tag{5}$$

Thus, the voltage-time integral S changes in proportion to the number of disconnected lamps. Therefore, the voltage-time integral S in a half cycle becomes an area $S_1$ when no lamps 122 are disconnected, and becomes an area $S_2$ which is larger than the area $S_1$ by the area S' when some of the lamps 122 are disconnected.

Accordingly it is possible to detect the quantity of the disconnected lamps by measuring the area $S_2$ including the area S' and then comparing the measured area $S_2$ with the reference area signal $S_1$.

Below, each signal in FIG. 4 is explained with reference to the time chart of FIG. 5 in both the case where there is no disconnected lamp (Area I) and the case where at least one lamp is disconnected (Area II).

The voltage signal v is converted into the signal vs in the detector 23. The signal vs takes the level "1" when the voltage signal v crosses the zero level and remains at the level "1" for a predetermined time which is sufficiently smaller than the interval between the times when the voltage signal v crosses the zero level. The output Q of the flip-flop 24 takes the level "1" when the first signal vs takes the level "1" and takes the level "0" when the following signal vs takes the level "1".

Furthermore the pulse train Ck is made up of the number of pulses Cp which pass through the gate circuit 29 when the output Q of the flip-flop 24 is at the level "1". The digital counting value SD is the output of the counter 30 which counts the number of pulses of the pulse train Ck. The digital counting value SD is cleared to zero when the signal shot signal Ss takes the level "1".

Moreover, the digital value MD is an output of the adjuster 31 which is set with an analog value or a digital value as a disconnected lamp alarm quantity. The digital value MD is kept at a constant value unless the set value of the adjuster 31 is changed. The digital counting value SD is compared with the digital set value MD in the digital comparator 32. When the digital counting value SD becomes larger than the digital set value MD, the alarm signal As is generated to the alarm device 33. Accordingly, the alarm device 33 causes the alarm buzzer or lamp to operate to indicate that the number of the disconnected lamps 122 in the series lamp circuit 12 exceeds the permitted number.

With the above-described simple circuit shown in FIG. 4, it is possible to easily and rapidly detect the number of disconnected lamps with increased sensitivity.

Although the above described embodiment of the invention has been explained using a thyristor-type constant current regulator (CCR) as a current control device for the power source, this invention is not restricted to this embodiment. For example, this invention can be applied to a lamp circuit where an RC type CCR with an LC resonance circuit is used.

In the above discussed embodiment shown in FIG. 4, the relay contact 15 and the reactor 14 are used as a means for producing a small current flow through the load. This invention is not restricted to this embodiment. For example, in place of the relay contact 15 and the reactor 14, the thyristor-type CCR 20 can be used as a means for producing a small current flow by controlling the firing angle of the thyristors 3 and 4.

Since the voltage-time integral S, as indicated in the equation (5) is proportional to the number n of the disconnected lamps 122, the relationship is as shown in FIG. 7. By constructing the circuit shown in the block diagram of FIG. 8, it is therefore possible to display the number n of the disconnected lamps 122.

Figure 8:
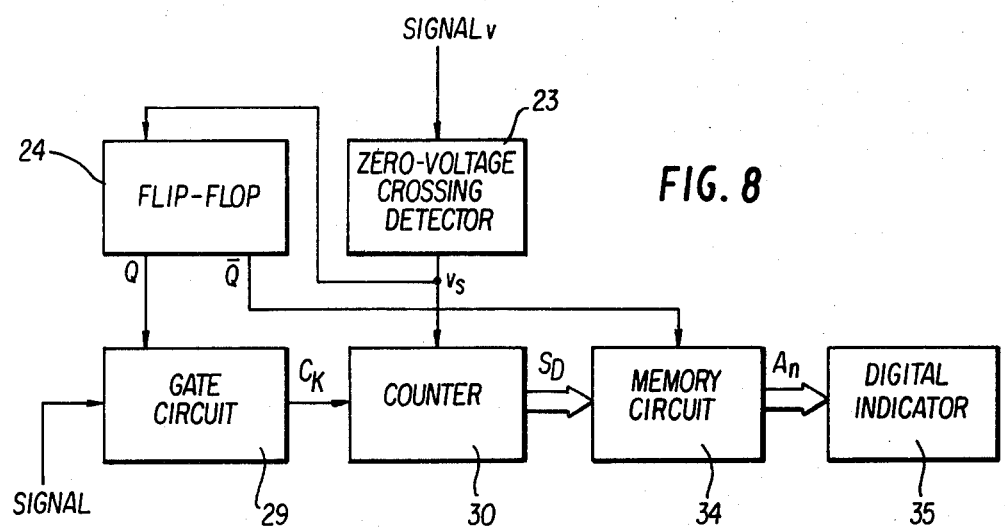
FIG. 8 is a circuit diagram of a digital display circuit for displaying the number of disconnected lamps of another embodiment of the present invention.

Referring now to FIG. 8, the numeral 34 represents a memory circuit in which the digital input value SD is divided by a predetermined value to produce the divided digital output An. The divided digital output An is also latched in the memory circuit 34. A digital indicator 35 includes one or more light emitting diodes which are turned on in response to the digital output An of the memory circuit 34.

In the embodiment shown in FIG. 8, the digital counting value SD in the counter 30, which counts the number of pulses of the pulse train Ck from the gate circuit 29, is latched in the memory circuit 34 when the inverse output Q of the flip-flop 24 takes the level "1", i.e., when the counting in the counter 30 is finished. The latched signal in the memory circuit 34 is divided by a predetermined value and its divided digital value is supplied to the digital indicator 35 as the display signal An. As a result light emitting diodes are lighted according to the digital output signal An and thereby the number of disconnected lamps 122 is digitally displayed.

Thus, since the number of the disconnected lamps present can always be displayed, it is possible to plan the replacement of the disconnected lamps in advance.

Figure 9:
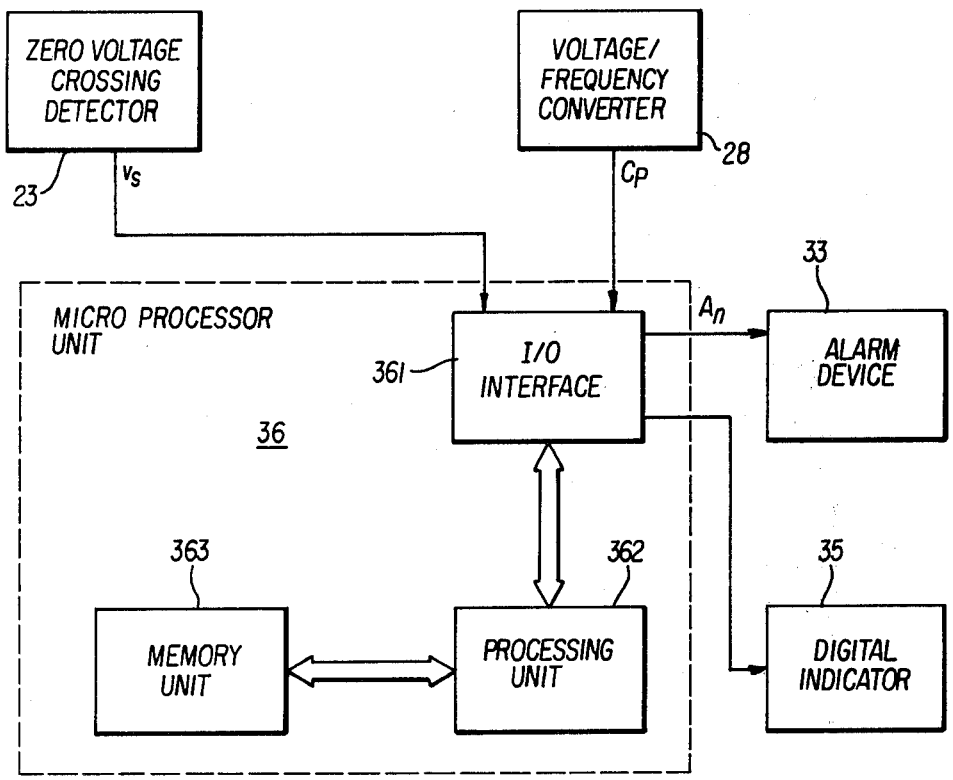
FIG. 9 is a circuit diagram of a lamp circuit of another preferred embodiment of this invention.

Another preferred embodiment of a lamp circuit according to this invention is shown with reference to FIG. 9, wherein a part of the circuitry shown in FIGS. 4 and 8 is replaced by a microprocessor unit 36. That is to say, the signal vs of the zero voltage crossing detector 23 and the pulse train Cp of the voltage/frequency converter 28 are supplied to an I/O interface 361. A processing unit 362 begins to count the number of pulses in the pulse train Cp when the signal vs first takes the level "1" and stops counting when the signal vs subsequently takes the level "1". This counting function is performed in a register (not shown) of the processing unit 362.

The counted value SD in the register of the processing unit 362 is compared with a predetermined digital value MD in the processing unit 362. The value MD represents a permitted quantity of disconnected lamps and is stored at a predetermined address in the memory unit 363. When the counted value SD exceeds the predetermined value MD, the alarm signal AS is supplied from the I/O interface 361 to the alarm device 33.

After the predetermined digital values $MD_1$, $MD_2$, $-MD_m$ corresponding to the number of disconnected lamps 122 are stored in predetermined addresses in the memory unit 363, the counted value SD in the register of the processing unit 362 is compared with these predetermined digital values $MD_1$, $MD_2$-$MD_m$ in the processing unit 362. Therefore, it is possible to supply the compared signal An, corresponding to the number of disconnected lamps, through the I/O interface 361 to a digital indicator 35 which displays the number of disconnected lamps 122.

Moreover, although this invention has been explained by way of an example using the voltage detector 21 and the zero voltage crossing detector 23 as individual circuits, respectively, it should be apparent that, if desired, a voltage detecting circuit could be utilized combining these functions.

Furthermore, although this invention has been explained by way of examples where the counting of a number of pulses in the pulse train Ck in the counter 30 is done once during each cycle of the AC power source, it is also possible to count the number of pulses in the pulse train Ck once during each half cycle. Moreover, by comparing an averaged value of the digital counted value SD during a few cycles with the predetermined digital value MD of the adjuster 31 representing the disconnected quantity, it is also possible to prevent misoperation due to noise, etc.

As described above, this invention makes use of the fact that the rise of the bypass current of the CCR is delayed, the fact that the voltage rises until the isolation transformer having the disconnected lamp is magnetically saturated due to the disconnected lamp, and the fact that the voltage-time integral during this time is proportional to the number of the disconnected lamps. This invention is constructed such that the number of pulses of a pulse train having a frequency corresponding to the load voltage is counted whereby an alarm signal indicating that lamps are disconnected is generated and/or a display of the number of the disconnected lamps is carried out.

According to this invention, it is possible to detect with high accuracy the disconnected quantity of lamps because the current flowing through the circuit is a sinusoidal current and there is no voltage oscillation due to the magnetic saturation of the isolation transformers connected to disconnected lamps. Moreover, according to this invention, in order to detect the disconnected lamps it is sufficient that a small current be allowed to flow in the series lamp circuit, so detection of the disconnected lamps can be performed without lighting the lamps in the daytime when the lighting of the lamps is not necessary, and checking the disconnected state of the lamps can be made prior to actual operation thereof.

According to this invention, since the number of the disconnected lamps can be easily displayed, it is possible to plan the replacement of the disconnected lamps according to the state of the display in advance, and thus the efficiency of the maintenance work in the airport can be improved.

Furthermore, this invention is not limited to installation in airports; for example, it is also possible to apply the invention to all series lighting circuits using isolation transformers.

Obviously, many modifications and variations of this invention are possible in light of the teachings of this invention. It is therefore to be understood that within the scope of the appended claims, the invention may be practiced otherwise than as specifically described herein.

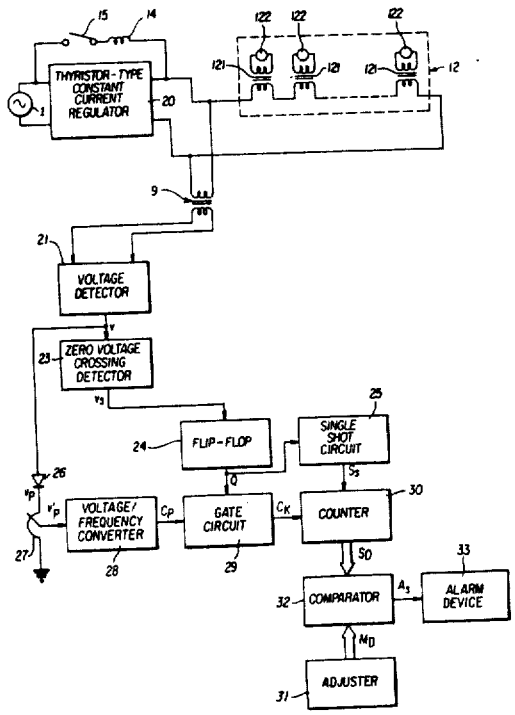

What is claimed as new and desired to be secured by Letters Patent of the United States is:

1. A lamp circuit, comprising:
   AC power supply means for supplying an AC current;
   a plurality of isolation transformers coupled in series with each other, said series coupled plurality of isolation transformers being coupled to receive said AC current from said AC power supply means;
   a plurality of lamps, each one of said plurality of lamps being coupled to one of said plurality of isolation transformers respectively; and
   disconnected lamp detecting means coupled to said AC power supply means for detecting an output voltage of said AC power supply means and for determining a voltage-time integral of said detected output voltage during a predetermined time period, comprising,
   voltage detecting means coupled to said AC power supply means for detecting said output voltage of said AC power supply means, comprising zero voltage crossing detector means coupled to said voltage detecting means for receiving said detected output voltage and for producing a voltage level detected signal when said detected output voltage crosses the zero voltage level, wherein said predetermined time period is a half cycle of said AC current as detected by said zero voltage crossing detector means, and voltage-time integral determining means coupled to said voltage detecting means for receiving said detected output voltage and for determining said voltage-time integral of said output voltage during said predetermined time period;

wherein said AC power supply means comprises means for supplying to said plurality of series coupled isolation transformers a small current which is insufficient to light said plurality of lamps.

2. The lamp circuit as recited in claim 1, wherein:
said means for determining said predetermined time period determines said predetermined time period once every half cycle of said AC power supply means.

3. The lamp circuit as recited in claim 1 wherein said voltage-time integral determining means comprises:

voltage converter means coupled to said voltage detecting means for receiving said detected output voltage and for producing a converted signal having a characteristic proportional to said detected output voltage; and integrator means coupled to said voltage converter means for receiving said converted signal and for integrating said converted signal during said predetermined time period.

4. The lamp circuit as recited in claim 3, wherein:
said voltage converter means produces a pulse signal as said converted signal, the frequency of said pulse signal being proportional to said detected output voltage; and said integrator means counts the number of pulses in said pulse signal during said predetermined time period and produces an integral signal, said integral signal representing the number of pulses counted by said integrator means.

5. The lamp circuit as recited in claim 4, wherein said voltage converter means includes a voltage to frequency converter.

6. The lamp circuit as recited in claim 4, wherein said integrator means includes a counter.

7. The lamp circuit as recited in claim 1, wherein:
said means for determining said predetermined time period determines said predetermined time period once every cycle of said AC power supply means.

8. The lamp circuit as recited in claim 4, wherein:
said voltage converter means comprises a voltage to frequency converter, said voltage to frequency converter producing said pulse signal;

said integrator means comprises a counter, said counter producing said integral signal; and said means for determining said predetermined time period includes a flip-flop coupled to said zero voltage crossing detector for receiving said voltage level detected signal and a gate circuit coupled to said voltage to frequency converter and to said flip-flop for directing said pulse signal to an input of said counter in response to the output signal to said flip-flop.

9. The lamp circuit as recited in claim 8, wherein said disconnected lamp detecting means further includes:

adjustor means for producing a digital reference signal;

comparator means coupled to said counter for receiving said integral signal and coupled to said adjustor means for receiving said digital reference signal for comparing said integral signal with said digital reference signal and for producing a comparison signal according to the result of the comparison; and alarm means coupled to said comparator means for receiving said comparison signal and for producing an alarm in response to said comparison signal.

10. The lamp circuit as recited in claim 8, wherein said disconnected lamp detecting means further includes:

means coupled to said counter for receiving said integral signal and for producing a digital display signal in response to said integral signal; and display means coupled to said display signal producing means for receiving said digital display signal and for producing a display in response to said display signal.

11. The lamp circuit as recited in claim 10, wherein said display signal producing means comprises:

memory means coupled to said counter for receiving said integral signal, for producing said digital display signal in response to said integral signal, and for storing said digital display signal.

12. The lamp circuit as recited in claim 1, wherein said disconnected lamp detecting means further comprises:

comparator means for comparing said voltage-time integral with a predetermined value and for producing a comparison signal according to the result of the comparison.

13. The lamp circuit as recited in claim 12, wherein said disconnected lamp detecting means further comprises:

adjuster means for producing said predetermined value, said comparator means being coupled to receive said predetermined value from said adjustor means.

14. The lamp circuit as recited in claim 13, wherein:
said adjustor means produces said predetermined value as a digital signal; and said comparator means produces said comparison signal in digital form.

15. The lamp circuit as recited in claim 12, which further comprises:

alarm means coupled to said comparator means for receiving said comparison signal and for producing an alarm according to said comparison signal.

16. The lamp circuit as recited in claim 1, wherein said disconnected lamp detecting means further comprises:

means for producing a display signal in response to said voltage-time integral.

17. The lamp circuit as recited in claim 16, wherein said display signal producing means produces said display signal in digital form.

18. The lamp circuit as recited in claim 17, which further comprises:

display means coupled to said display signal producing means for receiving said display signal and for producing a display in response to said display signal.

19. The lamp circuit as recited in claim 1, wherein said AC power supply means comprises:

a source of AC power; and wherein said means for supplying said small current is coupled between said source of AC power and said plurality of series coupled isolation transformers.

20. The lamp circuit as recited in claim 19, wherein said means for supplying said small AC current comprises:
a reactor coupled in series with said source of AC power and said plurality of series coupled isolation transformers.

21. The lamp circuit as recited in claim 19, wherein said AC power supply means further comprises:
a constant-current regulator which is coupled in parallel with said means for supplying said small AC current.

22. The lamp circuit as recited in claim 21, wherein said constant-current regulator is a thyristor-type constant current regulator.

23. The lamp circuit as recited in claim 21, wherein said constant-current regulator is a resistance-capacitance-type constant current regulator.

24. The lamp circuit as recited in claim 1, wherein said AC power supply means comprises:
a source of AC power; and
thyristor-type constant current regulator means coupled between said source of AC power and said plurality of series coupled isolation transformers for supplying a constant AC current to said plurality of series coupled isolation transformers;
wherein said means for supplying said small current comprises said thyristor-type constant current regulator means having means for limiting said AC current to a small AC current which is insufficient to light said plurality of lamps.

25. A lamp circuit, comprising:
AC power supply means for supplying an AC current;
a plurality of isolation, transformers coupled in series with each other, said series coupled plurality of isolation transformers being coupled to receive said AC curent from said AC power supply means;
a plurality of lamps, each one of said plurality of lamps being coupled to one of said plurality of isolation transformers respectively; and
disconnected lamp detecting means coupled to said AC power supply means for detecting an output voltage of said AC power supply means and for determining a voltage-time integral of said detected output voltage during a predetermined time period, comprising,
voltage detecting means coupled to said AC power supply means for detecting said output voltage,
voltage to frequency converter means coupled to said voltage detecting means for producing a pulse signal having a frequency proportional to said detected output voltage,
zero voltage crossing detector means coupled to said voltage detecting means for receiving said detected output voltage and for producing a voltage level detected signal when said detected output voltage crosses the zero voltage level, and
digital computer means coupled to receive said pulse signal from said voltage to frequency converter means and coupled to receive said voltage level detected signal from said zero voltage crossing detector for determining said predetermined time period as a half cycle of said AC current in response to said voltage level detected signal and for converting the number of pulses occuring in said pulse signal during said predetermined time period to produce an integral signal, said integral signal representing the number of pulses counted by said digital computer during said predetermined time period;
wherein said AC power supply means supplies a small AC current to said plurality of series coupled isolation transformers which is insufficient to light said plurality of lamps.

26. The lamp circuit as recited in claim 25, wherein:
said digital computer means includes means for storing a digital reference signal and means for comparing said integral signal with said digital reference signal and for producing a comparison signal according to the result of the comparison; and
said disconnected lamp detecting means further comprises alarm means coupled to said digital computer means for receiving said comparison signal and for producing an alarm in response to said comparison signal.

27. The lamp circuit as recited in claim 25, wherein:
said digital computer means includes means for producing a digital display signal in response to said integral signal; and
said disconnected lamp detecting means further comprises display means coupled to said digital computer means for receiving said digital display signal and for producing a display in response to said display signal.

28. The lamp circuit as recited in claim 27, wherein:
said digital computer means further includes means for storing a plurality of digital reference signals; and
said digital display signal producing means compares said integral signal with said plurality of reference signals to produce said digital display signal.

* * * * *

UNITED STATES PATENT AND TRADEMARK OFFICE
CERTIFICATE OF CORRECTION

PATENT NO. : 4,396,868

DATED : August 2, 1983

INVENTOR(S) : Toshisuke Watanabe et al.

It is certified that error appears in the above-identified patent and that said Letters Patent is hereby corrected as shown below:

The title page should be deleted to appear as per attached title page.

Signed and Sealed this

Twenty-fifth Day of September 1984

[SEAL]

Attest:

GERALD J. MOSSINGHOFF

Attesting Officer

Commissioner of Patents and Trademarks

United States Patent [19]

Watanabe et al.

[11] 4,396,868
[45] Aug. 2, 1983

[54] LAMP CIRCUIT WITH DISCONNECTED LAMP DETECTING DEVICE

[75] Inventors: Toshisuke Watanabe, Hachiooji; Shozo Taniguchi, Fussa; Osafumi Takemoto, Tokyo, all of Japan

[73] Assignee: Tokyo Shibaura Denki Kabushiki Kaisha, Kanagawa, Japan

[21] Appl. No.: 238,116

[22] Filed: Feb. 25, 1981

[30] Foreign Application Priority Data

Mar. 13, 1980 [JP] Japan .................. 55-30878

[51] Int. Cl.³ ............................. H02K 33/00
[52] U.S. Cl. ...................... 315/130; 315/131; 315/189; 340/642
[58] Field of Search ............... 340/642; 315/130, 131, 315/189

[56] References Cited

U.S. PATENT DOCUMENTS

| | | | |
|---|---|---|---|
| 3,054,991 | 9/1962 | Howell | 340/642 |
| 3,061,828 | 10/1962 | Hauck | 340/642 |
| 3,892,735 | 8/1974 | Berlock et al. | 315/131 |
| 4,295,079 | 10/1981 | Otsuka et al. | 340/642 |

*Primary Examiner*—Harold A. Dixon
*Attorney, Agent, or Firm*—Oblon, Fisher, Spivak, McClelland & Maier

[57] ABSTRACT

A lamp circuit is provided having a constant current-type AC power source and a plurality of isolation transformers coupled in series with the AC power source. The secondary circuit of each isolation transformer is connected to an electric lamp. The output voltage of the constant current-type AC power source is detected to determine the times when the output voltage crosses the zero voltage level. A disconnected lamp in the circuit results in a distortion of the output voltage waveform due to the magnetic-saturation characteristics of the isolation transformer coupled to the disconnected lamp. The output voltage waveform is integrated over time between the time periods when the output voltage signal crosses the zero axis. The result of the integration is compared with a reference value. When the integrated value exceeds the reference value, an alarm signal is generated. The number of disconnected lamps may also be determined and displayed. The circuit includes a device for supplying a small current to the plurality of isolation transformers such that the status of the lamps in a circuit can be determined without illuminating any of the lamps in the circuit.

28 Claims, 9 Drawing Figures